(12) United States Patent
Takagi et al.

(10) Patent No.: US 7,084,026 B2
(45) Date of Patent: Aug. 1, 2006

(54) SEMICONDUCTOR DEVICE AND METHOD FOR FABRICATING THE SAME

(75) Inventors: Takeshi Takagi, Kyoto (JP); Akira Inoue, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 65 days.

(21) Appl. No.: 10/913,383

(22) Filed: Aug. 9, 2004

(65) Prior Publication Data

US 2005/0017265 A1    Jan. 27, 2005

Related U.S. Application Data

(62) Division of application No. 10/311,293, filed as application No. PCT/JP02/03025 on Mar. 27, 2002, now Pat. No. 6,781,163.

(30) Foreign Application Priority Data

Apr. 12, 2001  (JP) .............................. 2001-113437

(51) Int. Cl.
*H01L 21/8238* (2006.01)
*H01L 21/336* (2006.01)

(52) U.S. Cl. ...................................... 438/199; 438/279
(58) Field of Classification Search ................ 438/199, 438/206, 268, 279, 312
See application file for complete search history.

(56) References Cited

U.S. PATENT DOCUMENTS 6,512,252 B1    1/2003   Takagi et al.
6,620,665 B1 *  9/2003   Sugahara et al. ............ 438/184

FOREIGN PATENT DOCUMENTS

| EP | 449620    A  | 10/1991 |
| EP | 951071    A1 | 10/1999 |
| JP | 3-187269   A | 8/1991  |
| JP | 3-280437     | 12/1991 |
| JP | 8-293557   A | 11/1996 |
| JP | 9-97899      | 4/1997  |
| JP | 10-163342    | 6/1998  |

OTHER PUBLICATIONS

"SiGe-Channel Heterojunction p-MOSFET's", Sophie Verdonckt-Vanderbroek et al, IEEE Transactions on Electron Devices, vol. 41, No. 1, Jan. 1994, pp. 91-101.

* cited by examiner

*Primary Examiner*—Hsien-Ming Lee
(74) *Attorney, Agent, or Firm*—McDermott Will & Emery LLP

(57) ABSTRACT

A region of an Si layer 15 located between source and drain regions 19 and 20 is an Si body region 21 which contains an n-type impurity of high concentration. An Si layer 16 and an SiGe layer 17 are, in an as grown state, undoped layers into which no n-type impurity is doped. Regions of the Si layer 16 and the SiGe layer 17 located between the source and drain regions 19 and 20 are an Si buffer region 22 and an SiGe channel region 23, respectively, which contain the n-type impurity of low concentration. A region of an Si film 18 located directly under a gate insulating film 12 is an Si cap region 24 into which a p-type impurity ($5\times10^{17}$ atoms·cm$^{-3}$) is doped. Accordingly, a semiconductor device in which an increase in threshold voltage is suppressed can be achieved.

2 Claims, 13 Drawing Sheets

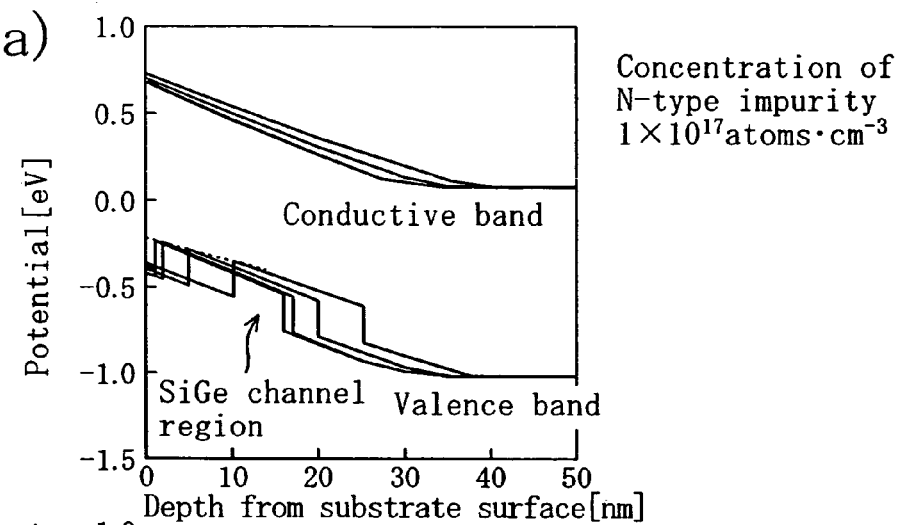
FIG. 3(a) — Concentration of N-type impurity $1 \times 10^{17}$ atoms·cm$^{-3}$
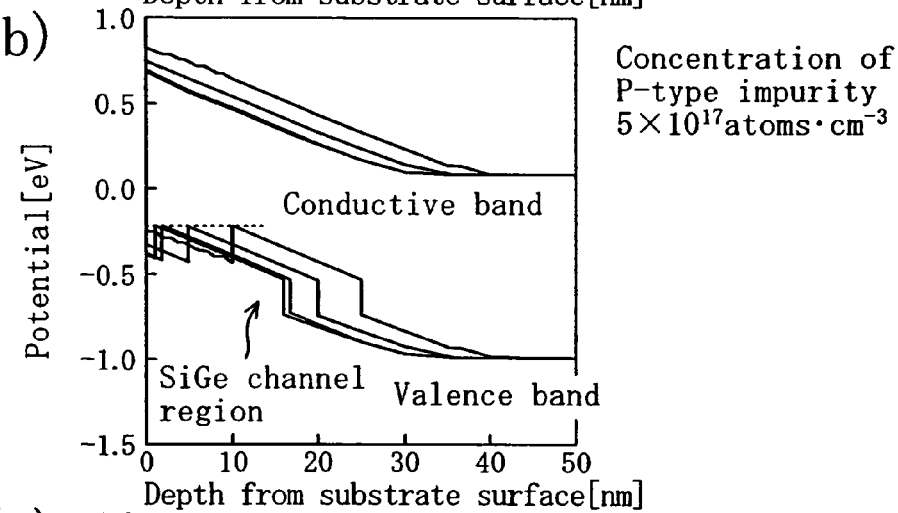
FIG. 3(b) — Concentration of P-type impurity $5 \times 10^{17}$ atoms·cm$^{-3}$
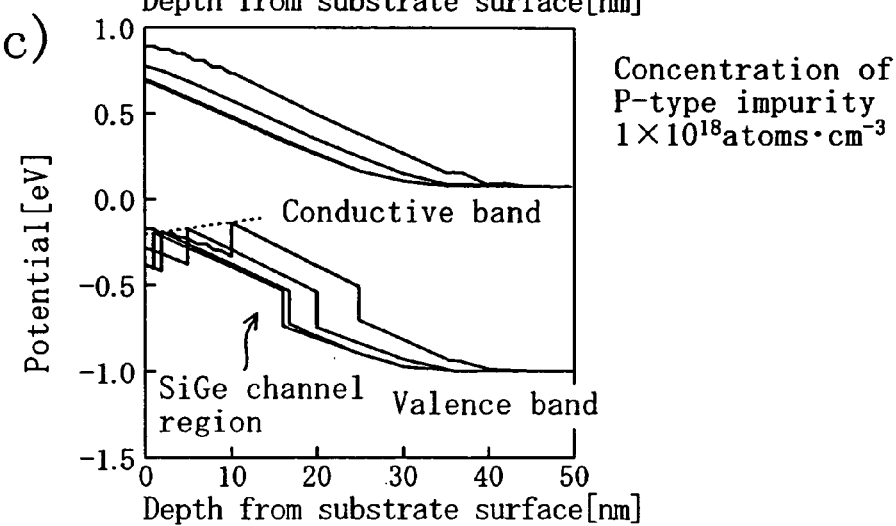
FIG. 3(c) — Concentration of P-type impurity $1 \times 10^{18}$ atoms·cm$^{-3}$ (a) Concentration of N-type impurity $1 \times 10^{17}$ atoms·cm$^{-3}$
(b) Concentration of P-type impurity $5 \times 10^{17}$ atoms·cm$^{-3}$
(c) Concentration of P-type impurity $1 \times 10^{18}$ atoms·cm$^{-3}$ (a) N-type Si cap region $1 \times 10^{17}$ atoms·cm$^{-3}$
    N-type body region $2 \times 10^{18}$ atoms·cm$^{-3}$
(b) P-type Si cap region $1 \times 10^{17}$ atoms·cm$^{-3}$
    N-type body region $2 \times 10^{19}$ atoms·cm$^{-3}$

SEMICONDUCTOR DEVICE AND METHOD FOR FABRICATING THE SAME

This application is a divisional of application Ser. No. 10/311,293 filed Dec. 17, 2002, now U.S. Pat. No. 6,781,163 which is a 371 application of PCT/JP02/03025, filed Mar. 27, 2002.

TECHNICAL FIELD

The present invention relates to field effect transistors including a heterojunction for a channel region, and more particularly relates to countermeasures against variation in threshold voltage of a field effect transistor.

BACKGROUND ART

In recent years, portable communication terminals represented by cellular phones are widely used. Such portable terminals are generally driven by batteries and it is strongly desired to reduce power consumption without sacrificing operation speed in portable terminals in order to prolong the lifetime of batteries. To achieve a portable communication terminal with low power consumption without reducing operation speed, it is effective to increase drain saturation current to maintain current driveability while lowering threshold voltage to reduce supply voltage in the portable terminal. To satisfy such demands, there have been many studies on heterojunction MOS transistors (which will be hereinafter called "hetero MOS") using as a channel region a material with high-mobility carriers.

In a known MOS transistor, carriers travel along the interface between a gate oxide film and a silicon substrate. Energy level largely fluctuates around the interface between the gate oxide film that is an amorphous layer and the silicon substrate that is a crystal layer. Because of the energy level fluctuation, carriers are easily affected by interface scattering in the known MOS transistor, resulting in problems such as reduction of carrier mobility and increase in noise.

On the other hand, in the hetero MOS, which is a MOS transistor including a semiconductor heterojunction for a channel region, a semiconductor heterojunction interface is formed at a depth with a small distance apart from the gate insulating film of a semiconductor substrate. A channel is formed at the semiconductor heterojunction interface and carriers travel along the channel. The semiconductor heterojunction interface is an interface where crystal layers are joined together, and thus energy level at the interface does not fluctuate widely. Therefore, the influence of interface scattering on carriers is small. Accordingly, the hetero MOS has a great current driveability and an excellent characteristic of reduction in noise. Furthermore, the hetero MOS has another characteristic that its threshold voltage can be lower than that of the known MOS transistor.

Problems to be Solved

However, in the hetero MOS including a heterojunction for a channel region, the channel region is embedded and therefore threshold voltage largely depends on the thickness of an Si cap region.

FIG. 15 illustrates the structure of a known hetero MOS.

As shown in FIG. 15, the known hetero MOS 100 includes an Si substrate 101, a gate insulating film 102 formed on the Si substrate 101, a gate electrode 103 which is formed of polysilicon containing a p-type impurity of high concentration on the gate insulating film 102, and a sidewall spacer 104 which is formed on the gate insulating film 102 to cover side faces of the gate electrode 103. The Si substrate 101 includes p-type source and drain regions 105 and 106 which are formed on both sides of the gate electrode, an n-type Si cap region 107 formed in a region located between the source and drain regions 105 and 106, an n-type SiGe channel region 108 formed under the Si cap region, 107 an n-type Si buffer region 109 formed under the SiGe channel region 108, and an n-type Si body region 110 formed under the Si buffer region 109.

FIG. 16 shows the results obtained from simulations of dependency of threshold voltage on the thickness of the Si cap region 107 in the known hetero MOS 100.

As shown in FIG. 16, as the thickness of the Si cap region 107 is increased, the absolute value for its threshold voltage remarkably increases. In other words, the threshold voltage is remarkably increased. This is because as the position at which the channel is formed (i.e., the interface between the Si cap region 107 and the SiGe channel region 108) is located a more distance apart from the gate electrode, i.e., further in depth, the potential at the channel changes less enough according to the gate voltage.

In terms of processing, however, the thickness of the Si cap region 107 is reduced through fabrication processes such as an $SiO_2$ thermal oxide film formation process and a cleaning process, and thus it is very difficult to control the thickness of the Si cap region 107. Therefore, nonuniformity in the thickness of the Si cap region 107 can be easily caused. Accordingly, variation in threshold voltage is easily caused and therefore there may be cases where a desired operation can not be performed because of increased threshold voltage.

Particularly, in an integrated circuit including a plural number of identical transistors, variation in threshold voltage among the transistors causes gaps of switching time among the transistors. As a result, the timing gaps among the transistors in the integrated circuit occur, so that the integrated circuit may not operate properly. Moreover, under consideration of variation in threshold voltage among the transistors, in order to ensure an operation margin, the latest switching timing should be set as a standard timing and therefore it is difficult to increase in operation speed of the integrated circuit.

DISCLOSURE OF INVENTION

The present invention has been contrived in order to solve the foregoing problems and an object of the present invention is to provide a semiconductor device in which an increase in threshold voltage is suppressed.

A semiconductor device according to the present invention includes: a substrate; a semiconductor layer formed in an upper part of the substrate; a gate insulating film formed on the semiconductor layer; a gate electrode formed on the gate insulating film; first source/drain regions of a first conductivity type formed on both sides of the gate electrode in the semiconductor layer, respectively; a first cap region of the first conductivity type which is formed of a first semiconductor in a region of the semiconductor layer which is located between the first source/drain regions; a first channel region which is formed under the first cap region in the semiconductor layer and formed of a second semiconductor which has a lower potential for carriers at a band edge along which the carriers travel than the corresponding potential of the first semiconductor; and a first body region of a second conductivity type which is formed of a third semiconductor under the first channel region in the semiconductor layer.

The inventive semiconductor has the structure in which the first cap region of the first conductivity type which is formed of the first semiconductor, the first channel region which is formed under the first cap region and of the second semiconductor which has a lower potential for carriers at a band edge along which the carriers travel than the corresponding potential of the first semiconductor, and the first body region of the second conductivity type which is formed of the third semiconductor under the first channel region in the semiconductor layer. Accordingly, it is possible to achieve a semiconductor device in which an increase in threshold voltage according to an increase in the thickness of the first cap region is suppressed.

The gate electrode and the first body electrode may be electrically connected to each other.

Accordingly, when a gate bias voltage is applied to the gate electrode, forward bias voltage at the same level as the gate bias voltage is applied to the first channel region via the first body region. Therefore, when the gate bias is OFF, the inventive semiconductor device is in the same state as a regular MOS transistor, whereas when the gate bias is ON, the first body region is biased in the forward direction as the gate bias voltage is increased, and thus threshold voltage is reduced. That is to say, a semiconductor device which is operable with a lower threshold voltage can be achieved. Moreover, by forming the semiconductor device in the structure in which the gate electrode and the first body region are electrically connected to each other, the amount of variation in threshold voltage according to nonuniformity in the thickness of the first cap region can be further reduced.

The inventive semiconductor device has the structure in which the cap region is depleted when a gate bias is applied thereto.

It is preferable that the concentration of an impurity of the first conductivity contained in the first cap region is $1 \times 10^{17}$ atoms·cm$^{-3}$ or more.

It is preferable that the impurity of the first conductivity type is doped into the first cap region so that at zero bias the potential at a channel which is formed at the interface between the first channel region and the first cap region changes within the range of $\pm 0.05$ eV according to nonuniformity in the thickness of the first cap region.

Accordingly, it is possible to achieve a semiconductor device in which variation in threshold voltage is suppressed even if nonuniformity in the thickness of the cap region occurs.

It is preferable that the concentration of an impurity of the second conductivity type contained in the first body region is $5 \times 10^{18}$ atoms·cm$^{-3}$ or more.

Accordingly, the body current generated in the lateral parasitic bipolar transistor can be suppressed and kept at a low level. Furthermore, when a voltage is applied to between the source/drain regions, a depletion layer from the source/drain regions can be prevented from expanding. Therefore, even when the concentration of the impurity in the body region is increased, the threshold voltage can be kept at a low level. As a result, the short channel effect that is caused when the gate length is shortened can be prevented.

It is preferable that the thickness of the first cap region is 10 nm or less.

The first semiconductor may be silicon.

The inventive semiconductor device may be formed in the structure in which the second semiconductor is made of silicon and at least one of germanium and carbon.

The inventive semiconductor device may further include: an additional semiconductor layer formed in an upper part of the substrate; an additional gate insulating film formed on the additional semiconductor layer; an additional gate electrode formed on the additional gate insulating film; additional first source/drain regions of the first conductivity type formed on both sides of the additional gate electrode in the additional semiconductor layer, respectively; an additional first cap region of the first conductivity type which is formed of the first semiconductor in a region of the additional semiconductor layer which is located between the additional first source/drain regions; an additional first channel region which is formed of the second semiconductor under the additional first cap region in the additional semiconductor layer; and an additional first body region of the second conductivity type which is formed of the third semiconductor under the additional first channel region in the additional semiconductor layer.

Accordingly, even if nonuniformity in the thickness of the first cap region is caused in a fabrication process or between fabrication processes, it is possible to achieve a semiconductor device in which variation in threshold voltage between transistors is suppressed.

The inventive semiconductor device may include: an additional semiconductor layer formed in an upper part of the substrate; an additional gate insulating film formed on the additional semiconductor layer; an additional gate electrode formed on the additional gate insulating film; second source/drain regions of the second conductivity type formed on both sides of the additional gate electrode in the additional semiconductor layer, respectively; a second channel region formed of a fourth semiconductor in a region of the additional semiconductor layer which is located between the second source/drain regions; and a second body region of the first conductivity type which is formed of a fifth semiconductor under the second channel region in the additional semiconductor layer, and the semiconductor device may be formed in the structure that can function as a complementary device.

It is preferable that the second channel region is of the second conductivity type.

Accordingly, variation in threshold voltage in a transistor formed on the additional semiconductor layer can be suppressed.

The gate electrode and the first body region may be electrically connected to each other and the additional gate electrode and the second body region may be electrically connected to each other.

A method for fabricating a semiconductor device according to the present invention includes the steps of: a) forming in an upper part of a semiconductor substrate a first semiconductor layer including a first semiconductor region into which an impurity of a first conductivity type is doped and a second semiconductor region into which an impurity of a second conductivity type is doped as a complementary device; b) forming on the first semiconductor layer a second semiconductor layer and a third semiconductor layer which is formed of a semiconductor having a wider band gap than the second semiconductor layer; c) forming a mask on part of the third semiconductor layer located in the first semiconductor region, and then introducing an impurity of the first conductivity type into part of the third semiconductor located at least in the second semiconductor region, using the mask; d) removing the mask and then forming a gate insulating film and a gate electrode on part of the third semiconductor layer located in the first semiconductor region and part of the third semiconductor layer located in the second semiconductor region, respectively; and e) forming source/drain regions of the second conductivity type and source/drain regions of the first conductivity type in the first semiconductor region and in the second semiconductor region, respectively, by implanting ions of respective impurities into the first, second and third semiconductor layers using each of the gate electrodes as a mask.

According to the present invention, it is possible to achieve a semiconductor device which functions as a complementary device in which variation in threshold voltage in a hetero MIS formed in the second semiconductor region due to nonuniformity in the thickness of the third semiconductor layer that is to be the cap region can be suppressed. Furthermore, according to the present invention, no impurity of the first conductivity type is doped into the part of the third semiconductor layer which is located in the first semiconductor region. Therefore, in a semiconductor device which can be achieved according to the inventive method and functions as a complementary device, characteristics of a hetero MIS formed in the first semiconductor region are not degenerated.

It is preferable that in the step c), ions of the impurity of the first conductivity type are implanted so that the peak of the concentration profile of the impurity of the first conductivity type is in the second semiconductor layer or the third semiconductor layer.

Accordingly, variation in threshold voltage in a transistor formed in the first semiconductor region can be suppressed.

BRIEF DESCRIPTION OF DRAWINGS

FIGS. 3(a) through 3(c) are graphs showing band profiles at zero bias in three types of hetero MOS devices having the impurity profiles used for the simulations of FIG. 2.

FIG. 13(a) is an illustration showing band profiles of a p-hetero MOS included in the complementary hetero MOS of the present invention when a gate bias voltage is applied whereas

BEST MODE FOR CARRYING OUT THE INVENTION

Figure 1:
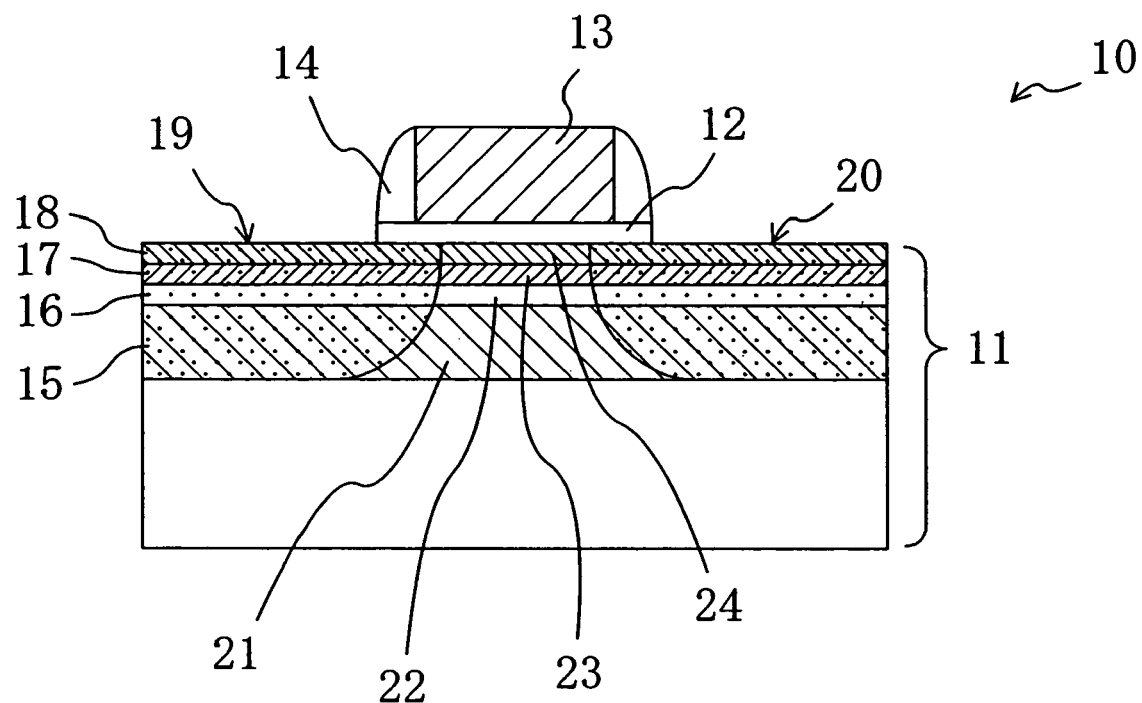
FIG. 1 is a view illustrating the cross-sectional structure of a hetero MOS in accordance with the present invention.

Hereinafter, embodiments of the present invention will be described with reference to the accompanying drawings. For the sake of simplicity, components common to the embodiments are identified by the same reference numerals.

EMBODIMENT 1

First, the structure of a hetero MOS in accordance with this embodiment will be described. FIG. 1 illustrates the cross-sectional structure of a p-channel hetero MOS 10 of this embodiment in which a SiGe layer is used as a channel region and an Si/SiGe heterojunction is utilized.

As shown in FIG. 1, the p-channel hetero MOS 10 of this embodiment includes a p-type Si substrate 11, a gate insulating film 12 which is formed of an $SiO_2$ film (having a thickness of about 6 nm) on the Si substrate 11, a gate electrode 13 which is formed of polysilicon containing a p-type impurity of high concentration on the gate insulating film 12, and a sidewall spacer 14 which is formed on the gate insulating film 12 to cover the side faces of the gate electrode 13.

The p-channel hetero MOS 10 of this embodiment shown in FIG. 1 includes an Si layer 15, which has been formed in an upper part of the Si substrate 11 by introducing an n-type impurity of high concentration ($2\times10^{18}$ atoms·cm$^{-3}$) by ion implantation before crystals are grown in a semiconductor fabrication process. On the Si layer 15, an Si layer 16, an SiGe layer 17 and an Si layer 18 are epitaxially grown in this order by a UHV-CVD method.

Furthermore, in the p-channel hetero MOS 10 of this embodiment, source and drain regions 19 and 20 which contain a p-type impurity of high concentration are formed in regions of the Si layer 15, the Si layer 16, the SiGe layer 17 and the Si layer 18 which are located on the sides of the gate electrode 13.

A region of the Si layer 15 located between the source and drain regions 19 and 20 is an Si body region 21 containing the n-type impurity of high concentration. The Si layer 16 and the SiGe layer 17 are both undoped layers into which no n-type impurity is doped in an as-grown state. Regions of the Si layer 16 and the SiGe layer 17 located between the source and drain regions 19 and 20 are an Si buffer region 22 and an SiGe channel region 23, respectively, which contain the n-type impurity of low concentration. A region of the Si film 18 located directly under the gate insulating film 12 is an Si cap region 24 into which a p-type impurity ($5\times10^{17}$ atoms·cm$^{-3}$) is introduced. The gate insulating film 12 is formed by thermally oxidizing the Si layer 18. When the p-channel hetero MOS 10 of this embodiment is in operation, a gate bias voltage applied to the gate electrode 13 causes the SiGe channel region 23 and the Si cap region 24 to deplete and holes to travel along the SiGe channel region 23.

The thickness of the Si layer 16 is 10 nm and the thickness of the SiGe layer 17, i.e., the thickness of the SiGe channel region 23, is 15 nm. The Ge content in the SiGe channel region 23 is 30%.

Figure 2:
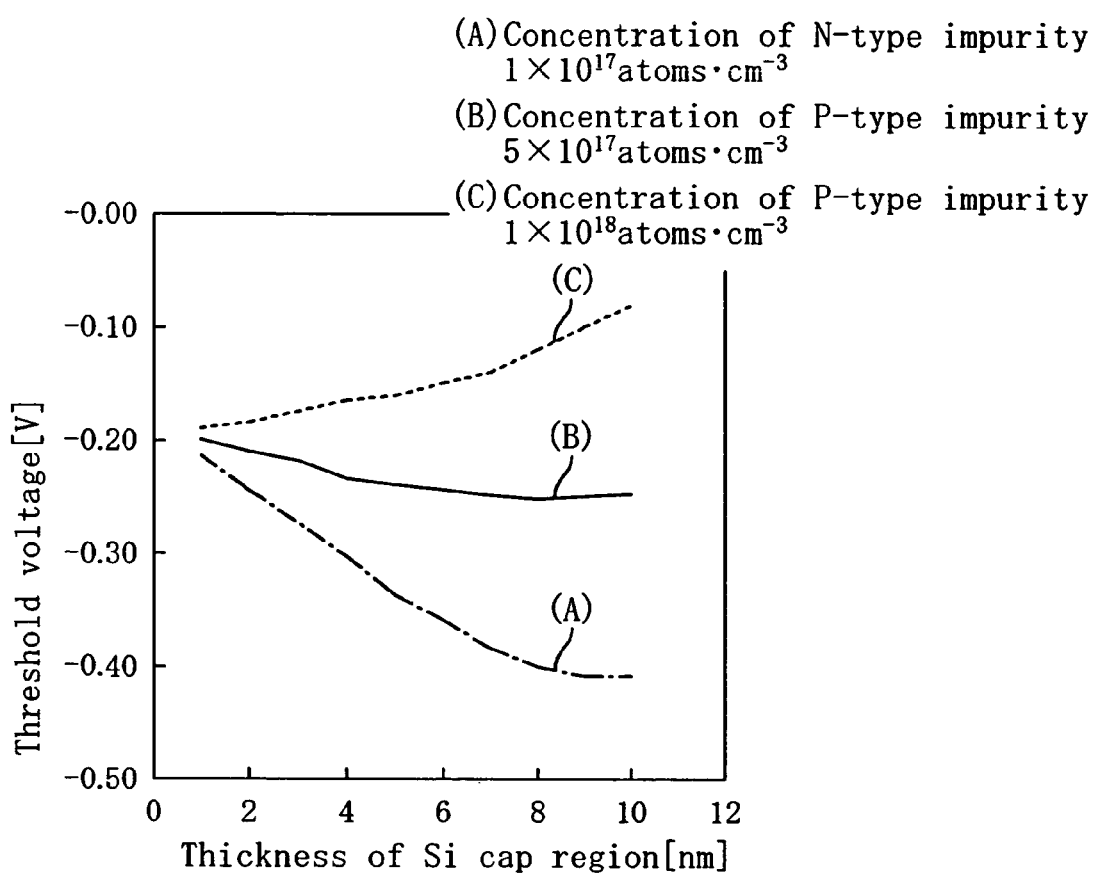
FIG. 2 is a graph showing the correlation between threshold voltage and the thickness of an Si cap region for a known hetero MOS and the hetero MOS of the present invention.

FIG. 2 shows the correlation between threshold voltage and the thickness of the Si cap region for the known hetero MOS 100 and the hetero MOS 10 of this embodiment.

In the known hetero MOS 100, an n-type impurity is doped into the Si cap region 107. The correlation between threshold voltage and the Si cap region for the known hetero MOS 100 is indicated by the dash-single-dot line (A) shown in FIG. 2.

On the other hand, as for the hetero MOS 10 of this embodiment including the Si cap region 24 into which the p-type impurity is doped at a concentration of about $5 \times 10^{17}$ atoms·cm$^{-3}$, the correlation between threshold voltage and the thickness of the Si cap region is indicated by the solid line (B) shown in FIG. 2. As can be seen from FIG. 2, as for the hetero MOS 10 of this embodiment, the variation in threshold voltage is small, compared to the known hetero MOS 100. Furthermore, at an increased concentration of the p-type impurity in the Si cap region 24 (i.e., a concentration of the p-type impurity of $1 \times 10^{18}$ atoms·cm$^{-3}$), in contrast to the known hetero MOS 100, the absolute value for threshold voltage becomes smaller, i.e., the threshold voltage decreases, as the thickness of the Si cap region 24 is increased, as indicated by the broken line (C) in FIG. 2. This is because the thickness of the Si cap region 24 is increased in the highly doped region and thereby the potential at the SiGe channel region 23 is reduced.

Accordingly, by doping a p-type impurity into the Si cap region 24, an increase in threshold voltage can be suppressed even when the thickness of the Si cap region 24 is increased because of fluctuation in a fabrication process and a difference between fabrication processes.

As for the known hetero MOS 100, the thickness of the Si cap region 107 is reduced through an SiO$_2$ thermal oxide film formation process, a cleaning process and the like during fabrication processes and thus it is very difficult to control the thickness of the Si cap region 107. Therefore, a difference in the thickness of the Si cap region 107 can be easily caused. This causes variation in threshold voltage even in a wafer and among identical wafers, which has been a big problem of the known hetero MOS.

According to this embodiment, however, by properly doping a p-type impurity into the Si cap region 24, variation in threshold voltage can be suppressed even if a difference in the thickness of the Si cap region 24 occurs between fabrication processes. Further description of how the variation in threshold voltage can be suppressed will be made with reference to FIG. 3.

FIGS. 3(a) through 3(c) are graphs illustrating the band profiles at zero bias for three types of hetero MOS devices having the impurity profiles used in the simulations of FIG. 2. FIGS. 3(a) through 3(c) each illustrate four different band profiles in the respective cases where the thickness of the Si cap region 24 is 1 nm, 2 nm, 5 nm, or 10 nm.

As shown in FIG. 3(a), in the known hetero MOS 100, the absolute value for the potential at the valance band in the SiGe channel region 23 (the convex upward slope segment in FIG. 3(a)) increases as the thickness of the Si cap region 24 is increased. This causes an increase in threshold voltage.

On the other hand, as shown in FIG. 3(b), in the hetero MOS 10 of this embodiment in which the p-type impurity at about $5 \times 10^{17}$ atoms·cm$^3$ is doped into the Si cap region 24, even if nonuniformity in the thickness of the Si cap region 24 occur, the potential at the valence band in the SiGe channel region 23 (the convex upward slope segment in FIG. 3(b)) is kept almost constant and the potential at an edge of the valence band around the interface between the SiGe channel region 23 and the Si cap region 24 changes within the range of ±0.05 eV. That is to say, variation in threshold voltage is suppressed.

Furthermore, when the concentration of the p-type impurity that is doped into the Si cap region 24 is increased, as shown in FIG. 3(c), the absolute value for the potential at the valence band in the SiGe channel region 23 (the convex upward slope segment in FIG. 3(c)) reduces as the thickness of the Si cap region 24 is increased. This reduction corresponds to the reduction in threshold voltage indicated by the broken line in FIG. 2.

From the foregoing description, it can be understood that in order to suppress variation in threshold voltage due to nonuniformity in the thickness of the Si cap region 24, the concentration of an impurity to be doped can be set such that the potential at the SiGe channel region 23 is kept almost constant.

Figure 4:
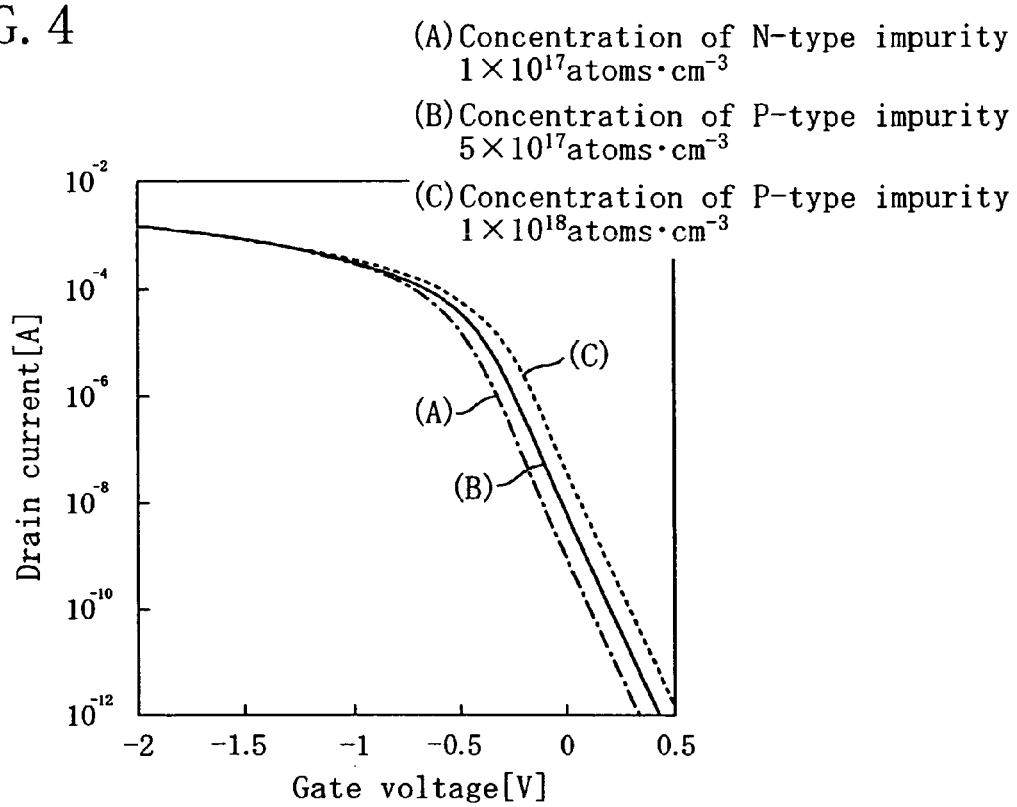
FIG. 4 is a graph showing the Vg-Id characteristics of three types of hetero MOS devices including different Si cap regions.

Next, the Vg-Id characteristics of the three types of hetero MOS devices each including a Si cap region of a different impurity concentration will be shown in FIG. 4. FIG. 4 shows the results obtained from simulations of the Vg-Id characteristics of the three types of hetero MOS devices shown in FIGS. 2 and 3. In this case, the thicknesses of the Si cap region 24 and the Si cap region 107 are both 5 nm.

As shown in FIG. 4, in the hetero MOS 10 of this embodiment indicated by the solid line (B) in which the p-type impurity at about $5 \times 10^{17}$ atoms·cm$^{-3}$ is doped into the Si cap region 24, a predetermined drain current can flow at a lower gate voltage than in the known hetero MOS 100 indicated by the dash-single-dot line (A). Furthermore, when the concentration of the p-type impurity that is doped into the Si cap region 24 is increased, a predetermined drain current can flow at a further lower gate voltage as indicated by the broken line (C).

As can be understood from the foregoing description, the hetero MOS 10 of this embodiment in which the p-type impurity is doped into the Si cap region 24 can achieve the effect that threshold voltage can be lower than that in the known hetero MOS 100. In order to suppress variation in threshold voltage in a hetero MOS due to nonuniformity in the thickness of the Si cap region 24, the concentration of the p-type impurity contained in the Si cap region 24 need only be $1 \times 10^{17}$ atoms·cm$^{-3}$ or more. Furthermore, the concentration of the p-type impurity contained in the Si cap region 24 is preferably $1 \times 10^{18}$ atoms·cm$^{-3}$ or less. This is because a great effect of suppressing variation in threshold voltage in the hetero MOS due to nonuniformity in the thickness of the Si cap region 24 can be gained within the range of the p-type impurity described above, as shown in FIGS. 2 and 3.

Figure 5:
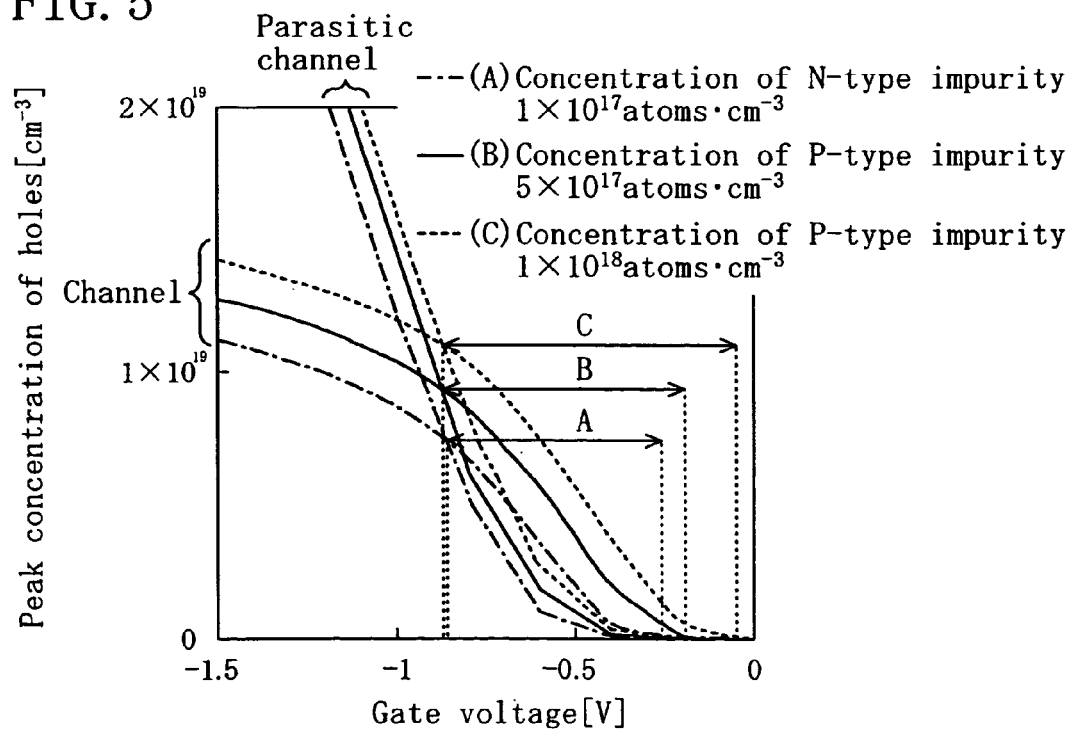
FIG. 5 is a graph on which the peak concentrations of holes stored in a channel and a parasitic channel are plotted against gate voltage in a hetero MOS.

FIG. 5 is a graph on which peaks of the concentration of holes which are stored around the interface between the gate insulating film 12 (SiO$_2$) and the Si cap region 24 (i.e., parasitic channel) and the interface between the Si cap region 24 and the SiGe channel region 23 (i.e., channel) by applying a gate voltage are plotted against the gate voltage.

As shown in FIG. 5, in the known hetero MOS 100 (indicated by the dash-single-dot line (A)) including the Si cap region 107 into which the n-type impurity is doped (at a concentration of $1 \times 10^{17}$ atoms·cm$^{-3}$), the range in which the number of holes stored around the interface between the Si cap region 24 and the SiGe channel region 23 is larger than that of holes stored around the parasitic channel is indicated by the voltage range A of FIG. 5. On the other hand, in the hetero MOS 10 of this embodiment including the Si cap region 24 into which the p-type impurity is doped, it can be understood that the range in which the number of holes stored around the interface between the Si cap region 24 and the SiGe channel region 23 is larger than that of holes stored around the parasitic channel expands to the voltage range B and to the voltage range C in this order as the concentration of the p-type impurity is increased to $5 \times 10^{17}$ atoms·cm$^{-3}$ (indicated by the solid line (B)) and then to $1 \times 10^{18}$ atoms·cm$^{-3}$ (indicated by the broken line (C)). This shows that the parasitic channel in question in the known hetero MOS 100 can be suppressed, resulting in a high drive current.

As has been described, by properly introducing a p-type impurity into the Si cap region 24, variation in threshold voltage in the hetero MOS due to nonuniformity in the thickness of the Si cap region 24 can be suppressed. Accordingly, even if nonuniformity in the thickness of the Si cap region 24 occurs because fluctuation in a fabrication process and a difference between the fabrication processes, variation in threshold voltage in a wafer, among wafers, and among lots can be reduced. Specifically, in the case of fabricating an integrated circuit using a plurality of the hetero MOS devices 10 of this embodiment, it is preferable that the thickness of the Si cap region 24 of each of the hetero MOS devices 10 does not change widely in order to further reduce variation in threshold voltage among the hetero MOS devices 10. More specifically, the range of differences in the thickness of the Si cap region 24 is preferably 10 nm or less.

The threshold voltage in the hetero MOS can be also reduced. Furthermore, the parasitic channel in question in the known hetero MOS can be suppressed, resulting in a high drive current.

Although the p-channel hetero MOS using the SiGe channel region 23 has been described in this embodiment, the present invention is not limited thereto. Similar effects can be gained also in any n-channel hetero MOS devices into which are introduced respective impurities of opposite conductivity types to those of the p-channel hetero MOS. That is to say, as long as a hetero MOS has a structure in which an impurity whose conductivity is the same as that of carriers traveling along a channel is properly doped into a semiconductor layer (which corresponds to the Si cap region 24 of this embodiment) which exists between a channel region and a gate insulating film to form a heterojunction with the channel region, variation in threshold voltage in the hetero MOS can be suppressed. For example, a channel region formed of $Si_{1-x}C_x$, instead of the SiGe channel region 23, and an Si cap region into which an n-type impurity is doped may be used to form an n-channel hetero MOS. Alternatively, SiGeC may be used as a channel to form an n-channel hetero MOS using an Si cap region into which an n-type impurity is doped or to form a p-channel hetero MOS using an Si cap region into which a p-type impurity is doped. Furthermore, these MOS devices may be integrated to form a CMOS.

EMBODIMENT 2

Figure 6:
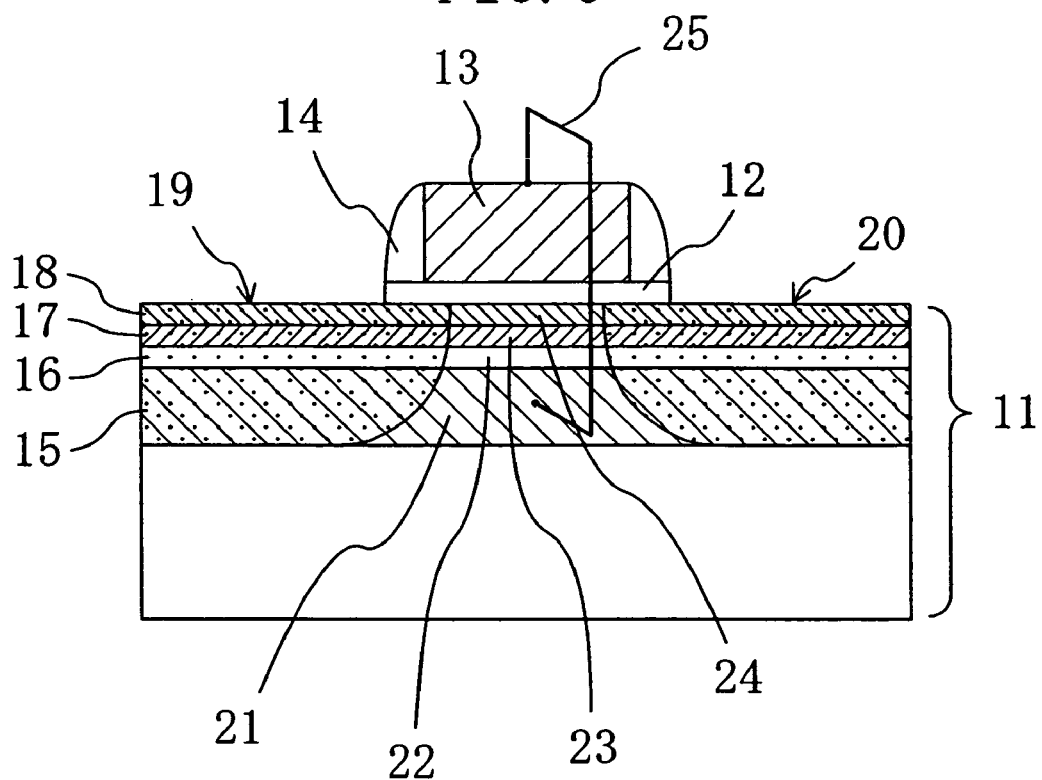
FIG. 6 is a view illustrating the cross-sectional structure of a hetero DTMOS in accordance with the present invention.
Figure 7:
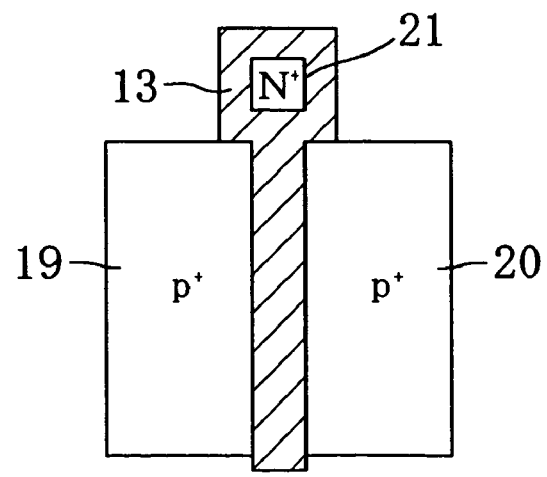
FIG. 7 is a plan view of the hetero DTMOS of the present invention.

Next, the structure of a hetero DTMOS in accordance with this embodiment will be described. FIG. 6 illustrates a cross-sectional structure of a p-channel hetero DTMOS 60 using a SiGe layer as a channel region and utilizing an Si/SiGe heterojunction according to this embodiment. FIG. 7 is a top view of the p-channel hetero DTMOS 60.

As shown in FIG. 6, the p-channel hetero DTMOS 60 of this embodiment includes a p-type Si substrate 11, a gate insulating film 12 which is formed of an SiO$_2$ film (having a thickness of about 6 nm) on the Si substrate 11, a gate electrode 13 which is formed of polysilicon containing a p-type impurity of high concentration on the gate insulating film 12, and a sidewall spacer 14 which is formed on the gate insulating film 12 to cover the side faces of the gate electrode 13.

The p-channel hetero DTMOS 60 of this embodiment shown in FIG. 6 includes an Si layer 15, which has been formed in an upper part of the Si substrate 11 by introducing an n-type impurity at a high concentration ($2 \times 10^{18}$ atoms·cm$^{-3}$) by ion implantation before crystals are grown in a semiconductor fabrication process. On the Si layer 15, an Si layer 16, an SiGe layer 17 and an Si layer 18 are epitaxially grown in this order by a UHV-CVD method.

Furthermore, in the p-channel hetero DTMOS 60 of this embodiment, source and drain regions 19 and 20 that contain a p-type impurity of high concentration are formed in regions of the Si layer 15, the Si layer 16, the SiGe layer 17 and the Si layer 18 which are located on both sides of the gate electrode 13.

A region of the Si layer 15 located between the source and drain regions 19 and 20, is an Si body region 21 which contains the n-type impurity of high concentration. The Si body region 21 and the gate electrode 13 are electrically connected to each other by an interconnect 25. Specifically, as shown in FIG. 7, the gate electrode 13 and the Si body region 21 are directly connected to each other outside of the region in which a channel is to be formed.

The Si layer 16 and the SiGe layer 17 are both undoped layers into which no n-type impurity is doped in an as-grown state. Regions of the Si layer 16 and the SiGe layer 17 located between the source and drain regions 19 and 20 are an Si buffer region 22 and an SiGe channel region 23, respectively, which contain the n-type impurity of low concentration. A region of the Si film 18 located directly under the gate insulating film 12 is an Si cap region 24 into which a p-type impurity ($5 \times 10^{17}$ atoms·cm$^{-3}$) is introduced. The gate insulating film 12 is formed by thermally oxidizing the Si layer 18. When the p-channel hetero MOS 10 of this embodiment is in operation, a gate bias voltage applied to the gate electrode 13 causes the SiGe channel region 23 and the Si cap region 24 to deplete and holes to travel along the SiGe channel region 23.

The thickness of the Si layer 16 is 10 nm and the thickness of the SiGe layer 17, i.e., the thickness of the SiGe channel region 23, is 15 nm. The Ge content in the SiGe channel region 23 is 30%.

As can be understood from the foregoing description, the hetero DTMOS of this embodiment has basically the same structure as the hetero MOS described in Embodiment 1. However, the hetero DTMOS of this embodiment is different from the hetero MOS in that the gate electrode 13 and the Si body region 21 are electrically connected to each other.

In the hetero DTMOS 60 of this embodiment, as shown in FIG. 6, the gate electrode 13 and the Si body region 21 are electrically connected to each other. Because of this, when a gate bias voltage is applied to the gate electrode 13, a forward bias voltage at the same level as the gate bias voltage is applied to the Si channel region 23 via the Si body region 21. Therefore, when the gate bias is OFF, the hetero DTMOS is in the same state as a regular MOS transistor, whereas when the gate bias is ON, the Si body region 21 is biased in the forward direction as the gate bias voltage is increased, and thus threshold voltage is reduced. Accordingly, the hetero DTMOS of this embodiment is operable with a lower threshold voltage, compared to DTMOS using a known Si substrate.

Furthermore, in the hetero DTMOS 60 of this embodiment, since the substrate bias coefficient γ can be set at a large value, the threshold voltage is largely reduced during operation and the effective gate overdrive is increased. As a result, a high ON current can be obtained. That is to say, according to the hetero DTMOS 60 of this embodiment, great current driveability and high speed switching can be achieved even at a low voltage.

Figure 8:
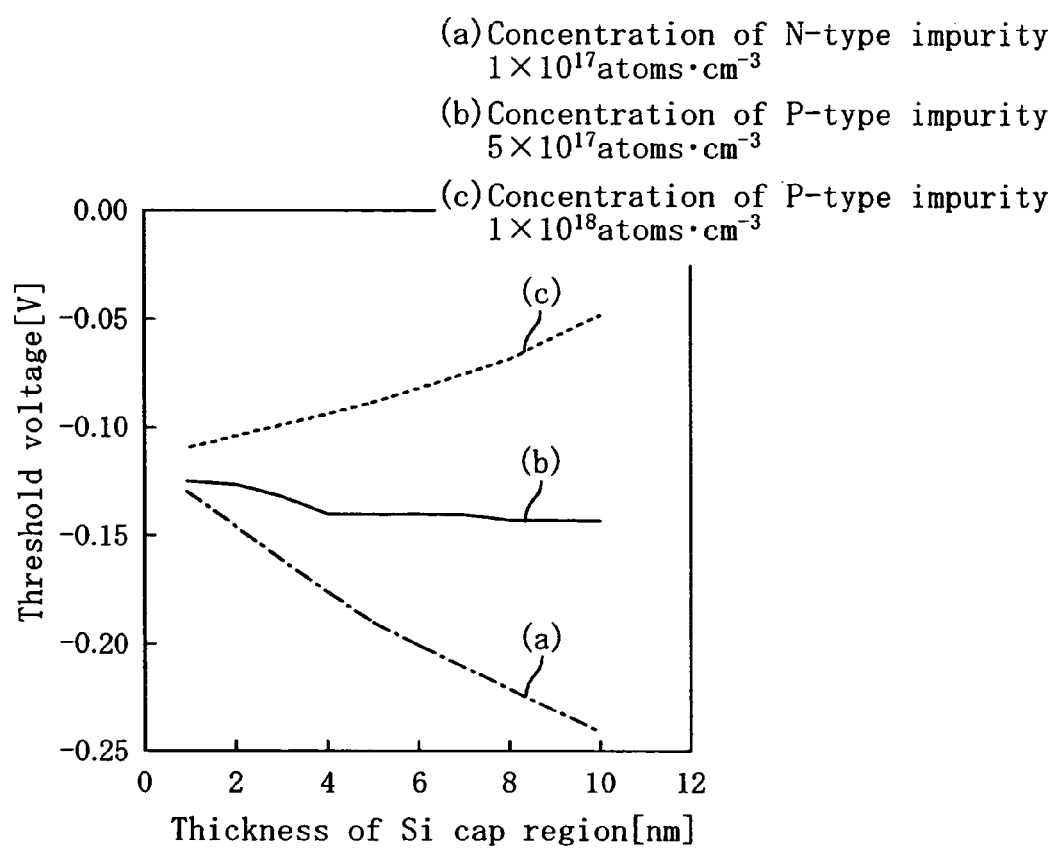
FIG. 8 is a graph showing the correlation between threshold voltage and the thickness of an Si cap region for a known hetero DTMOS and the hetero DTMOS of the present invention.

FIG. 8 shows the correlation between threshold voltage and the thickness of the Si cap region for a hetero DTMOS which is obtained by electrically connecting the gate electrode 13 and the Si body region 21 in the known hetero MOS 100 (which will be hereinafter referred to a "known hetero DTMOS") and for the hetero DTMOS 60 of this embodiment in which the p-type impurity is introduced into the Si cap region 24.

In the known hetero DTMOS, the n-type impurity is doped into the Si cap region 107. The correlation between threshold voltage and the thickness of the Si cap region is indicated by the dash-single-dot line (a) in FIG. 8.

On the other hand, the correlation between the threshold voltage and the thickness of the Si cap region 24 for the hetero DTMOS 60 of this embodiment including the Si cap region 24 into which a p-type impurity at about $5 \times 10^{17}$ atoms·cm$^{-3}$ is doped is indicated by the solid line (b) in FIG. 5. As can be seen from FIG. 8, in the hetero DTMOS 60 of this embodiment, the variation in threshold voltage is smaller than that in the known hetero DTMOS. Furthermore, at an increased concentration of the p-type impurity in the Si cap region 24 (i.e., where the concentration of the p-type impurity is $1 \times 10^{18}$ atoms·cm$^{-3}$ as indicated by the broken line (c) in FIG. 8), the absolute value for threshold voltage becomes smaller as the thickness of the Si cap region 24 is increased, in contrast to the known hetero DTMOS (indicated by the dash-single-dot line (a)). In other words, the threshold voltage is reduced. This is because the thickness of the Si cap region 24 is increased in the highly doped region and thereby the potential at the SiGe channel region 23 decreases.

Furthermore, the amount of the variation in the threshold voltage in this embodiment is smaller than in the hetero MOS 10 of Embodiment 1. This shows that the hetero DTMOS 60 of this embodiment is more effective to stabilize threshold voltage than the hetero MOS 10 of Embodiment 1. In order to suppress variation in threshold voltage in the hetero DTMOS due to nonuniformity in the thickness of the Si cap region 24, the concentration of the p-type impurity contained in the Si cap region 24 need only be $1 \times 10^{17}$ atoms·cm$^{-3}$ or more. Furthermore, the concentration of the p-type impurity contained in the Si cap region 24 is preferably $1 \times 10^{18}$ atoms·cm$^{-3}$ or less. This is because a great effect of suppressing variation in threshold voltage in the hetero MOS due to nonuniformity in the thickness of the Si cap region 24 can be gained within the range of the concentration of the p-type impurity described above, as shown in FIG. 8.

Figure 9:
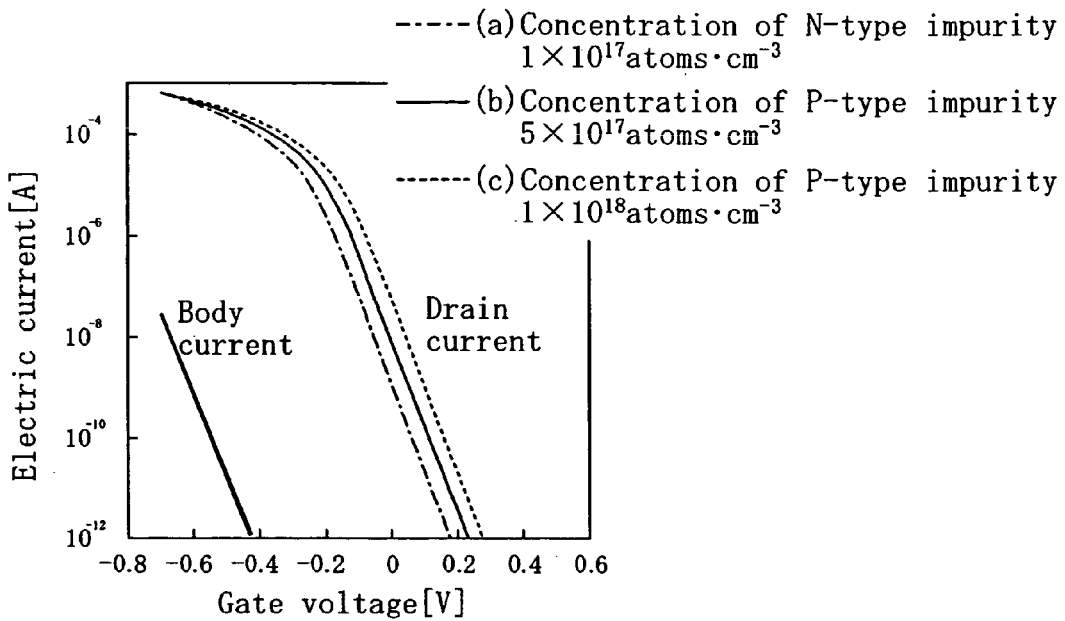
FIG. 9 is a graph showing the results obtained from simulations of the Vg-Id characteristics of the known hetero DTMOS and the hetero DTMOS of the present invention.

FIG. 9 shows the results obtained from simulations of the Vg-Id characteristics for the known hetero DTMOS, and the hetero DTMOS 60 of this embodiment in which the p-type impurity is introduced into the Si cap region 24. In this case, the thicknesses of the Si cap region 107 of the known hetero DTMOS and the Si cap region 24 of the hetero DTMOS 60 are both 5 nm.

Referring to FIG. 9, when the results for the known hetero DTMOS indicated by the dash-single-dot line (a) and the hetero DTMOS 60 of this embodiment indicated by the solid line (b) are compared, it can be understood that the threshold voltage can be reduced.

In a DTMOS, in general, a lateral parasitic bipolar transistor is generated through a p-type gate, an n-type body (base), a p-type source region 19 (emitter) and a drain region 20 (collector). When the transistor turns on and body current flows, the body current might practically become a problem.

Referring to FIG. 9, however, no difference in the body current is shown between the known hetero DTMOS and the hetero DTMOS 60 of this embodiment. That is to say, in the hetero DTMOS 60 of this embodiment, the difference between the body and drain currents is enlarged, so that the operation voltage range that is controlled by the body current can be enlarged.

Figure 10:
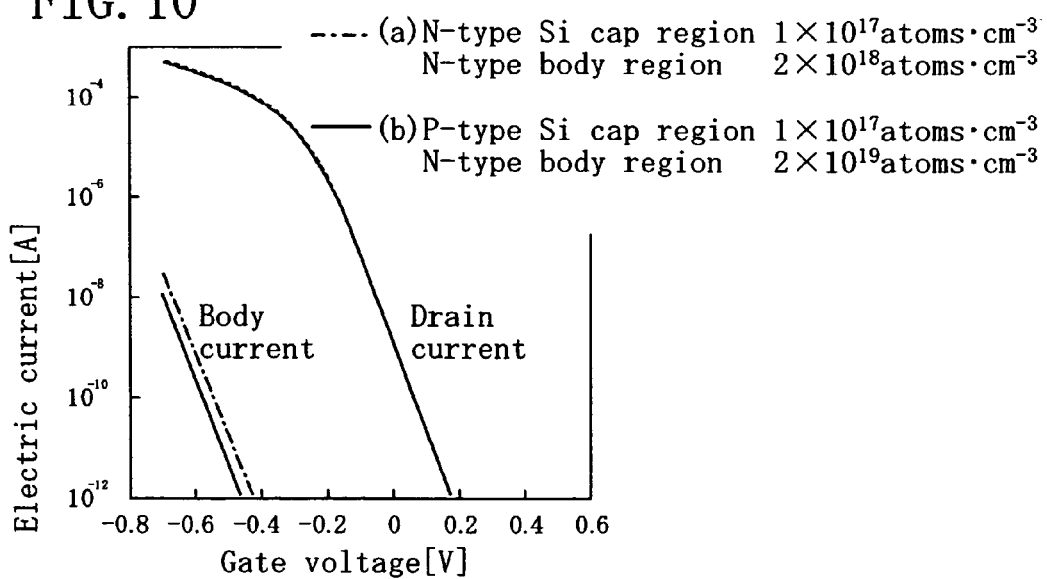
FIG. 10 is a graph showing the Vg-Id characteristics of the known hetero DTMOS and the hetero DTMOS of the present invention.

FIG. 10 is a graph showing the Vg-Id characteristics of each of the known hetero DTMOS (the concentration of the n-type impurity in the body region 21: $2 \times 10^{18}$ atoms·cm$^{-3}$) and the hetero DTMOS 60 of this embodiment, where the concentration of the n-type impurity in the Si body region 21 of the hetero DTMOS 60 of this embodiment is set at a higher level ($2 \times 10^{19}$ atoms·cm$^{-3}$) so that the threshold voltage of the hetero DTMOS 60 is equal to that of the known hetero DTMOS.

According to this embodiment, the p-type impurity is doped into the Si cap region 24 and thereby the threshold voltage is reduced. The concentration of the impurity in the body region 21 can be set a higher level in accordance with the reduction in threshold voltage. When the concentration of the impurity in the body region 21 is increased, a built-in potential is increased between the source and the body. Accordingly, the body current generated in the lateral parasitic bipolar transistor can be kept at a low level. That is to say, the operation voltage range can be enlarged. Furthermore, at an increased concentration of the impurity in the body region 21, when a voltage is applied to between the source and the drain, a depletion layer from the source region 19 and the drain region 20 can be prevented from expanding. Therefore, even when the concentration of the impurity in the body region is increased, the threshold voltage can be kept at a low level and the short channel effect that is caused when the gate length is shortened can be prevented. In this embodiment, the concentration of the impurity in the body region 21 is set at $2 \times 10^{19}$ atoms·cm$^{-3}$. However, similar effects can be achieved as long as the concentration is $5 \times 10^{18}$ atoms·cm$^{-3}$ or more.

As has been described, by properly doping a p-type impurity into the Si cap region 24, variation in threshold voltage due to nonuniformity in the thickness of the Si cap region can be suppressed. Accordingly, even if nonuniformity in the thickness of the Si cap region 24 occurs because of fluctuation in a fabrication process and a difference between fabrication processes, variation in threshold voltage in a wafer, among wafers, and among lots can be reduced. Specifically, in fabricating an integrated circuit using a plurality of the hetero DTMOS devices 20 of this embodiment, in order to further suppress variation in threshold voltage among the hetero MOS devices 60, it is preferable that nonuniformity in the thickness of the Si cap, regions 24 of the hetero DTMOS devices 60 are not so wide. More specifically, the range of nonuniformity in the thickness of the Si cap regions 24 is preferably 10 nm or less.

Also, the threshold voltage can be reduced by properly doping a p-type impurity into the Si cap region 24.

Moreover, the body current in question in the hetero DTMOS structure can be suppressed, and thereby a wide range of operation voltage can be achieved. Accordingly, the short channel effect can be sufficiently suppressed.

Although the p-channel hetero DTMOS using the SiGe channel region 23 has been described in this embodiment, the present invention is not limited to such a structure. Similar effects can be gained also in any n-channel hetero MOS devices into which are introduced respective impurities of the opposite conductivity types to those of the p-channel hetero DTMOS. That is to say, as long as a hetero DTMOS has a structure in which an impurity whose conductivity is the same as that of carriers traveling along a channel is properly doped into a semiconductor layer (corresponding to the Si cap region 24 of this embodiment) which exists between a channel region and a gate insulating film to form a heterojunction with the channel region, it is possible to achieve a hetero DTMOS in which variation in threshold voltage is suppressed. For example, a channel region formed of $Si_{1-x}C_x$, instead of the SiGe channel region 23, and an Si cap region into which the n-type impurity is doped may be used to form an n-channel hetero DTMOS. Moreover, SiGeC may be used as a channel to form an n-channel hetero DTMOS using an Si cap region into which the n-type impurity is doped or to form a p-channel hetero MOS using an Si cap region into which a p-type impurity is doped. Furthermore, these MOS devices may be integrated to form a complementary DTMOS.

EMBODIMENT 3

Figure 11:
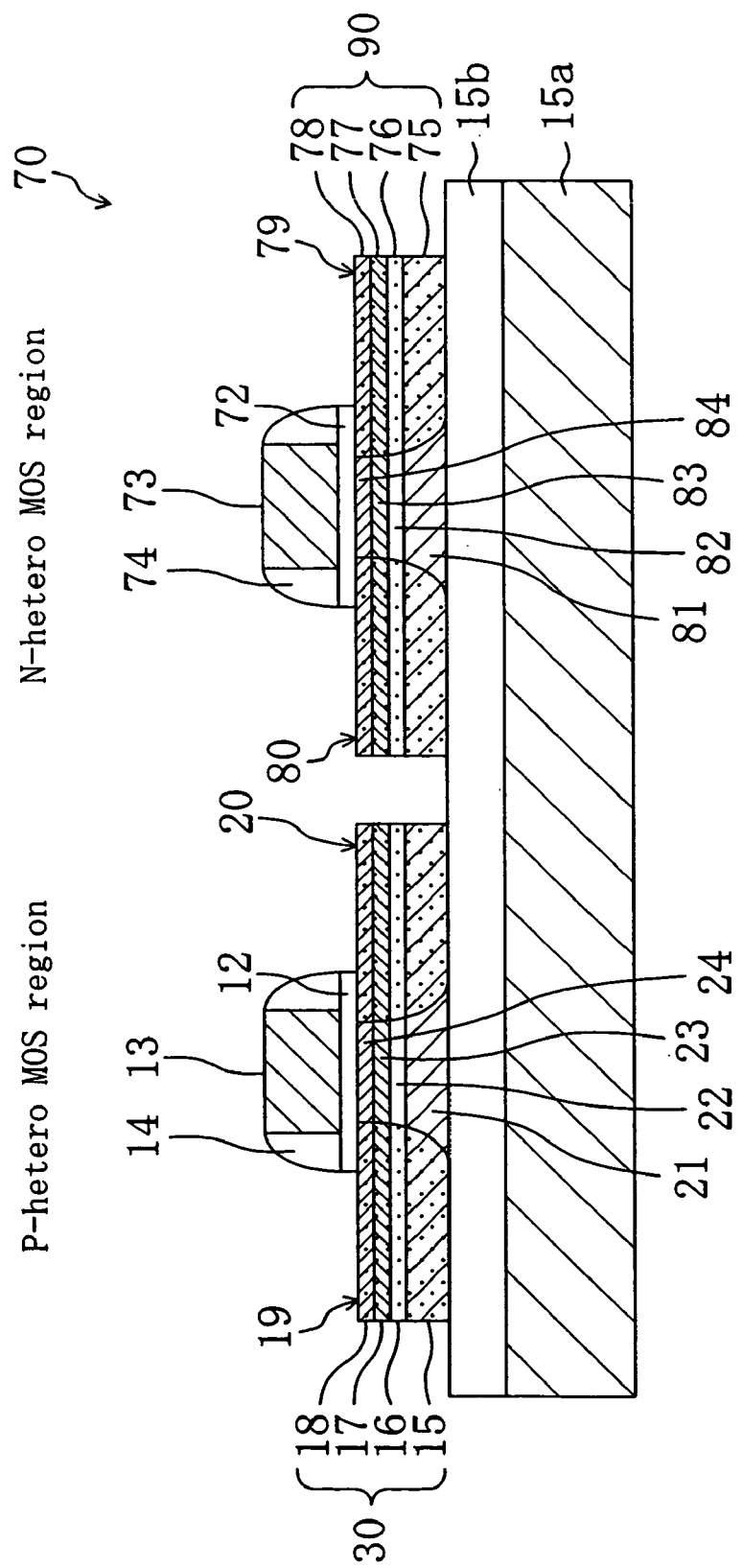
FIG. 11 is a view illustrating the cross-sectional structure of a complementary hetero MOS in accordance with the present invention in which an SiGe layer is used as a channel region and an Si/SiGe heterojunction is utilized.

According to this embodiment, the structure of a complementary hetero MOS will be described. FIG. 11 illustrates a cross-sectional structure of the complementary hetero MOS 70 of this embodiment using an SiGe layer as a channel region and utilizing an Si/SiGe heterojunction.

As shown in FIG. 11, the complementary hetero MOS 70 of this embodiment includes an Si layer 15a, an embedded oxide layer 15b which is formed by implanting oxygen ions into the Si layer 15a or like methods, a semiconductor layer 30 for a p-channel hetero MOS (hereinafter referred to a "p-hetero MOS") which is formed on the embedded oxide film 15b, and a semiconductor layer 90 for an n-channel hetero MOS (hereinafter referred to an "n-hetero MOS") which is formed on the embedded oxide film 15b. On the semiconductor layer 30, a gate insulating film 12 which is formed of an $SiO_2$ film (having a thickness of about 6 nm), a gate electrode 13 which is formed of polysilicon containing a p-type impurity of high concentration on the gate insulating film 12, and a sidewall spacer 14 which is formed on the gate insulating film 12 to cover the side faces of the gate electrode 13 are provided. On the semiconductor layer 90, a gate insulating film 72 formed of an $SiO_2$ film (having a thickness of about 6 nm), a gate electrode 73 which is formed of polysilicon containing an n-type impurity of high concentration on the gate insulating film 72, and a sidewall spacer 74 which is formed on the gate insulating film 72 to cover the side faces of the gate electrode 73.

In a fabrication process for the complementary hetero MOS 70 of this embodiment, an n-type impurity of high concentration ($2 \times 10^{13}$ atoms·cm$^{-3}$) is introduced into the semiconductor layer 30 for the p-hetero MOS by ion implantation before crystals are grown, and thereby an Si layer 15 is formed. On the Si layer 15, an Si layer 16, an SiGe layer 17 and an Si layer 18 are epitaxitially grown in this order by an UHV-CVD method. Furthermore, source and drain regions 19 and 20 which contain the p-type impurity of high concentration are formed in regions of the Si layer 15, the Si layer 16, the SiGe layer 17 and the Si layer 18 which are located on both sides of the gate electrode 13.

A region of the Si layer 15 located between the source region 19 and the drain region 20 is an Si body region 21 which contains the n-type impurity of high concentration. The Si layer 16 and the SiGe layer 17 are both undoped layers into which no n-type impurity is doped in an as-grown state. Regions of the Si layer 16 and the SiGe layer 17 located between the source and drain regions 19 and 20, are an Si buffer region 22 and an SiGe channel region 23, respectively, which contain the n-type impurity of low concentration. A region of the Si film 18 located directly under the gate insulating film 12 is an Si cap region 24 into which a p-type impurity ($5 \times 10^{17}$ atoms·cm$^{-3}$) is introduced. The gate insulating film 12 is formed by thermally oxidizing the Si layer 18.

A p-type impurity of high concentration ($2 \times 10^{18}$ atoms·cm$^{-3}$) is introduced into the semiconductor layer 90 for the n-hetero MOS at a high concentration by ion implantation before crystals are grown, and thereby an Si layer 75 is formed. On the Si layer 75, an Si layer 76, an SiGe layer 77 and an Si layer 78 are epitaxitially grown in this order by a UHV-CVD method. Furthermore, source and drain regions 79 and 80 which contain the n-type impurity of high concentration are formed in regions of the Si layer 75, the Si layer 76, the SiGe layer 77 and the Si layer 78 which are located on both sides of the gate electrode 73.

A region of the Si layer 75 located between the source region 79 and the drain region 80 is an Si body region 81 which contains the p-type impurity of high concentration. The Si layer 76 and the SiGe layer 77 are both undoped layers into which no p-type impurity is doped in an as-grown state. Regions of the Si layer 76 and the SiGe layer 77 located between the source and drain regions 79 and 80 are an Si buffer region 82 and an SiGe channel region 83, respectively, which contain the p-type impurity of low concentration. A region of the Si film 78 located directly under the gate insulating film 72 is an Si channel region 84. Specifically, the Si channel region 84 of the n-type hetero MOS of this embodiment is an undoped layer into which no impurity is doped in an as-grown state.

The thicknesses of the Si layers 16 and 76 are both 10 nm and the thicknesses of the SiGe layers 17 and 77, i.e., the thicknesses of the SiGe channel region 23 and the SiGe region 83, are both 15 nm. The Ge contents in the SiGe channel region 23 and the SiGe region 83 are both 30%.

As can be understood from the foregoing desription, the complementary hetero MOS 70 of this embodiment includes: the p-hetero MOS which is formed on an SOI substrate and has the almost same structure as the hetero MOS 10 of Embodiment 1; and the n-hetero MOS which is formed on the SOI substrate and has the almost same structure as the hetero MOS 10 of Embodiment 1 but is different from the hetero MOS 10 in that the conductivity type of each member is opposite to that of the corresponding member of the hetero MOS 10. Furthermore, in the n-hetero MOS, the p-type impurity is not doped into the Si channel region 84.

Next, a method for fabricating the complementary hetero MOS of this embodiment will be described with reference to FIG. 12. FIG. 12 illustrates cross-sectional views showing process steps of the method of this embodiment for fabricating the complementary hetero MOS 70.

Figure 12A:
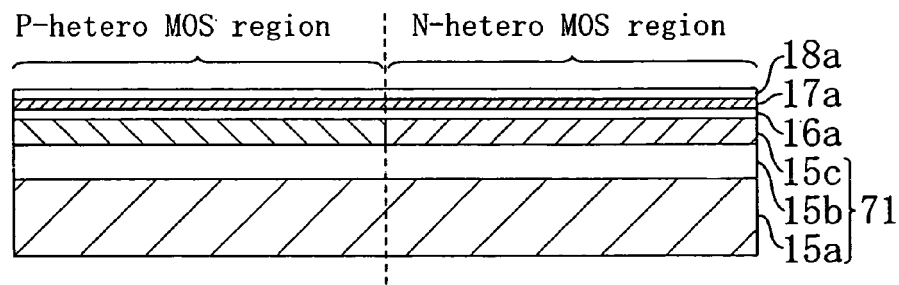
FIG. 12 includes cross-sectional views showing process steps of a method for fabricating the complementary hetero MOS of the present invention.

First, in the process step shown in FIG. 12(a), an SOI substrate 71 formed of an Si layer 15a, an embedded oxide film 15b and an Si layer 15c is prepared. Subsequently, an n$^+$ Si region (i.e., a p-hetero MOS region) and a p$^+$ Si region (i.e., an n-hetero MOS region) into which different impurities are doped, respectively, at a concentration of about $2\times10^{18}$ atoms·cm$^{-3}$ are formed by ion implantation. Thereafter, an Si layer 16a, an SiGe layer 17a, an Si layer 18a are epitaxially grown on the Si layer 15c in this order by a UHV-CVD method. In this case, each of the layers is an undoped layer and the layers are formed so that the respective thicknesses of the Si layer 16a, the SiGe layer 17a, the Si layer 18a are 10 nm, 15 nm, and 5 nm and that the Ge content in the SiGe layer 17a is 30%.

Figure 12B:
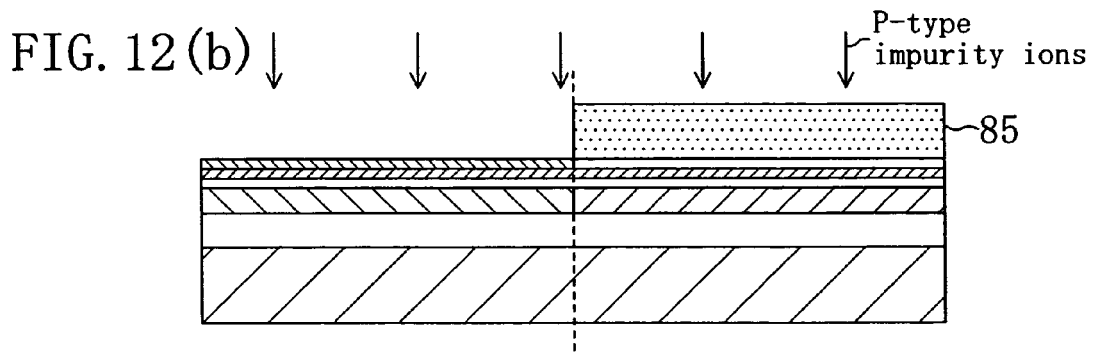

Next, in the process step shown in FIG. 12(b), a resist mask 85 is deposited on the n-hetero MOS region. Thereafter, a p-type impurity is doped into part of the Si layer 18a which is located in the p-hetero MOS region at a concentration of about $5\times10^{17}$ atoms·cm$^{-3}$ by ion implantation using the resist mask 85 as a mask.

Figure 12C:
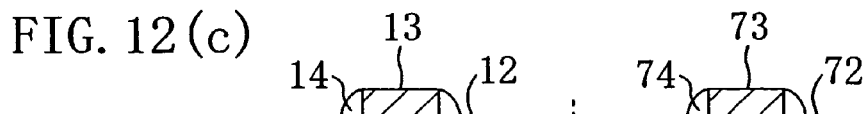

Next, in the process step shown in FIG. 12(c), the resist mask is removed and then the gate insulating films 12 and 72 are formed on parts of the Si layer 18a which are in the p-hetero MOS region and the n-hetero MOS region, respectively. Then, an n$^+$ gate electrode 13 formed of polysilicon, into which an n-type impurity of high concentration is doped, and a p$^+$ gate electrode 73 formed of polysilicon, into which a p-type impurity of high concentration is doped, are formed on the insulating films 12 and 72, respectively. Thereafter, sidewall spacers 14 and 74 are formed to cover the side faces of the gate electrodes 13 and 73.

Figure 12D:
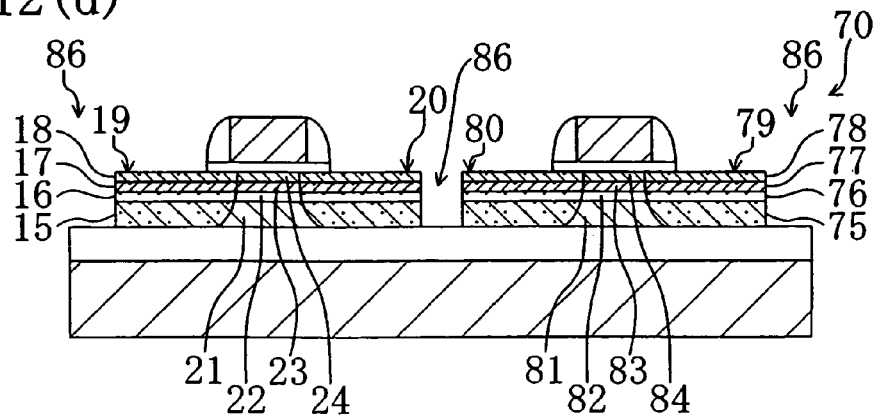

Next, in the process step shown in FIG. 12(d), impurity ions are implanted at a high concentration using each of the gate electrodes and the sidewall spacers as a mask, thereby forming p$^+$ type source and drain regions 19 and 20 and n$^+$ type source and drain regions 79 and 80.

Subsequently, a trench 86 is formed to isolate the p-hetero MOS region from the n-hetero MOS region. By this isolation, an Si layer 15, an Si layer 16, an SiGe layer 17 and an Si layer 18 are formed in the p-hetero MOS region whereas an Si layer 75, an Si layer 76, an SiGe layer 77 and an Si layer 78 are formed in the n-hetero MOS region.

At this time, in the region between the source and drain regions 19 and 20, an Si body region 21, an Si buffer region 22, an SiGe channel region 23 and an Si cap region 24 are formed. In the region between the source and drain regions 79 and 80, an Si body region 81, an Si buffer region 82, an SiGe region 83 and an Si channel region 84 are formed.

By the fabrication method which includes the foregoing process steps, the complementary hetero MOS 70 can be obtained.

Using the above-described fabrication method, a CMOS device using a high-performance hetero MOS can be fabricated in a simple manner. Note that a gate electrode and an Si body region may be electrically connected to each other by a contact in each of the p-hetero MOS and the n-hetero MOS to form a complementary hetero DTMOS.

According to this embodiment, by properly introducing a p-type impurity into the Si cap region 24 of the p-hetero MOS, variation in threshold voltage in a hetero MOS due to nonuniformity in the thickness of the Si cap region 24 can be suppressed. Accordingly, even if nonuniformity in the thickness of the Si cap region 24 occurs because of fluctuation in a fabrication process or between the fabrication processes, variation in threshold voltage in a wafer, among wafers, and among lots can be reduced. It is also possible to reduce the threshold voltage in the p-hetero MOS. Furthermore, the parasitic channel in question in the known hetero MOS can be suppressed, and thus a high drive current can be achieved.

Figure 13A:
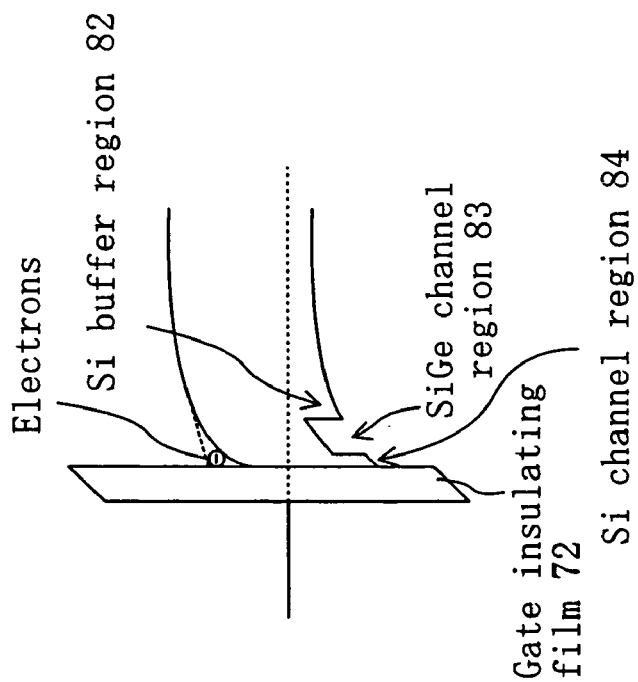

Furthermore, in the complementary hetero MOS 70 of this embodiment, no p-type impurity is doped into the Si channel region 84 of the n-hetero MOS. Therefore, the characteristics of the n-hetero MOS are not degenerated. This will be further described with reference to FIGS. 13(a) and 13(b). FIG. 13(a) shows band profiles of the p-hetero MOS included in the complementary hetero MOS 70 of this embodiment when gate bias voltage is applied thereto and FIG. 13(b) shows band profiles of the n-hetero MOS included in the complementary hetero MOS 70 of this embodiment when the gate bias voltage is applied thereto.

As shown in FIG. 13(a), in the p-hetero MOS, a channel is formed in the SiGe channel region 23 and holes travel along the channel.

Figure 13B:
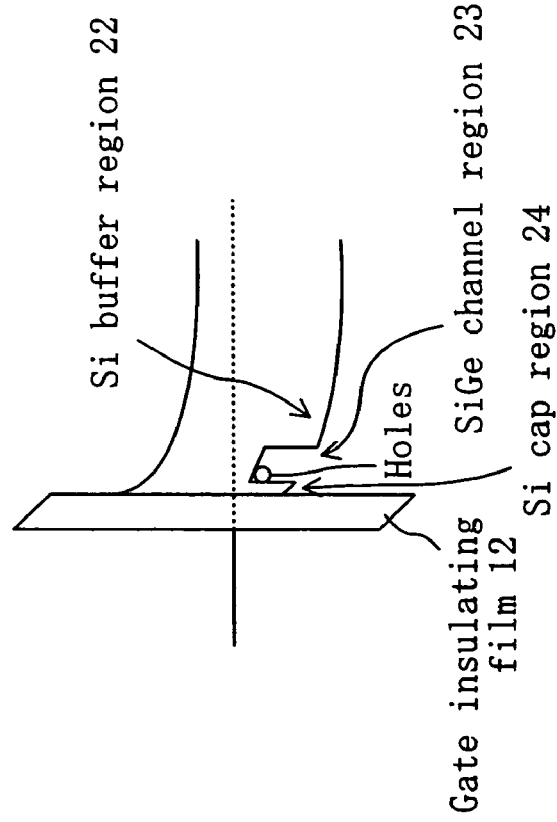
FIG. 13(b) is an illustration showing band profiles of an n-hetero MOS included in the complementary hetero MOS of the present invention when a gate bias voltage is applied.

As shown in FIG. 13(b), in the n-hetero MOS, a channel is formed in the Si channel region 84 and electrons travel along the channel. In the above-described method for fabricating the complementary hetero MOS 70, if the p-type impurity is introduced into the Si layer 18a by in-situ doping in the process step shown in FIG. 12(a), an Si layer 78 into which the p-type impurity is doped is formed at the end. Because of this, the valence band in the Si channel region 84 has such a potential as indicated by the broken line in FIG. 13(b) and, as a result, threshold voltage is increased.

According to this embodiment, however, in the process step shown in FIG. 12(a), the p-type impurity is not introduced by in-situ doping but by ion implantation into only the part of the Si layer 18a which is located in the p-hetero MOS region. As a result, almost no p-type impurity has been doped into the Si region 78 even at the end. Accordingly, the valence band in the Si channel region 84 has such a potential as one indicated by the solid line in FIG. 13(b). Therefore, the increase in threshold voltage in the n-hetero MOS is suppressed and thus the characteristics of the n-hetero MOS are hardly degenerated.

Figure 14:
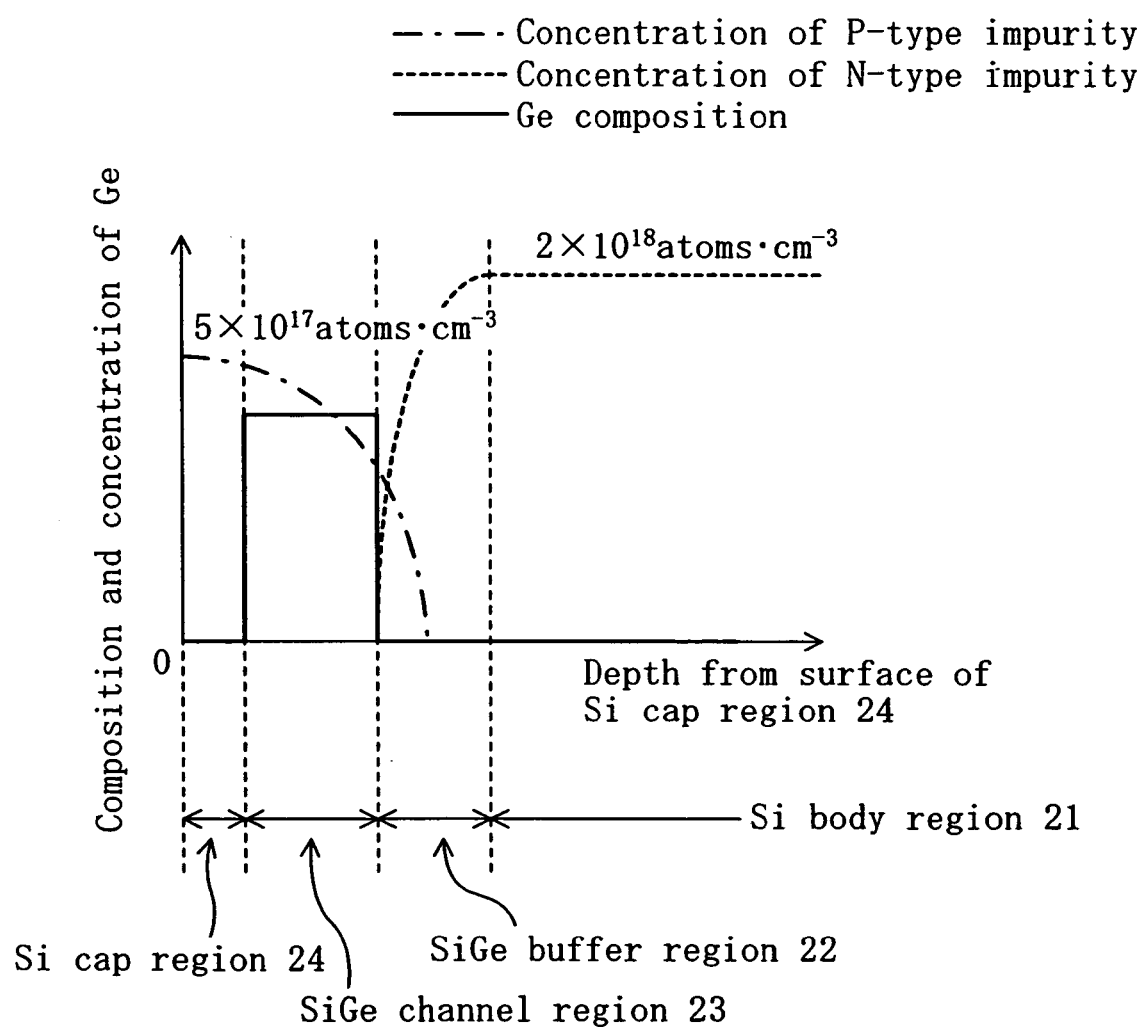
FIG. 14 is an illustration showing the Ge contents and impurity profiles in an Si body region, an Si buffer region, an SiGe channel region and an Si cap region of a p-hetero MOS included in the complementary hetero MOS.
Figure 15:
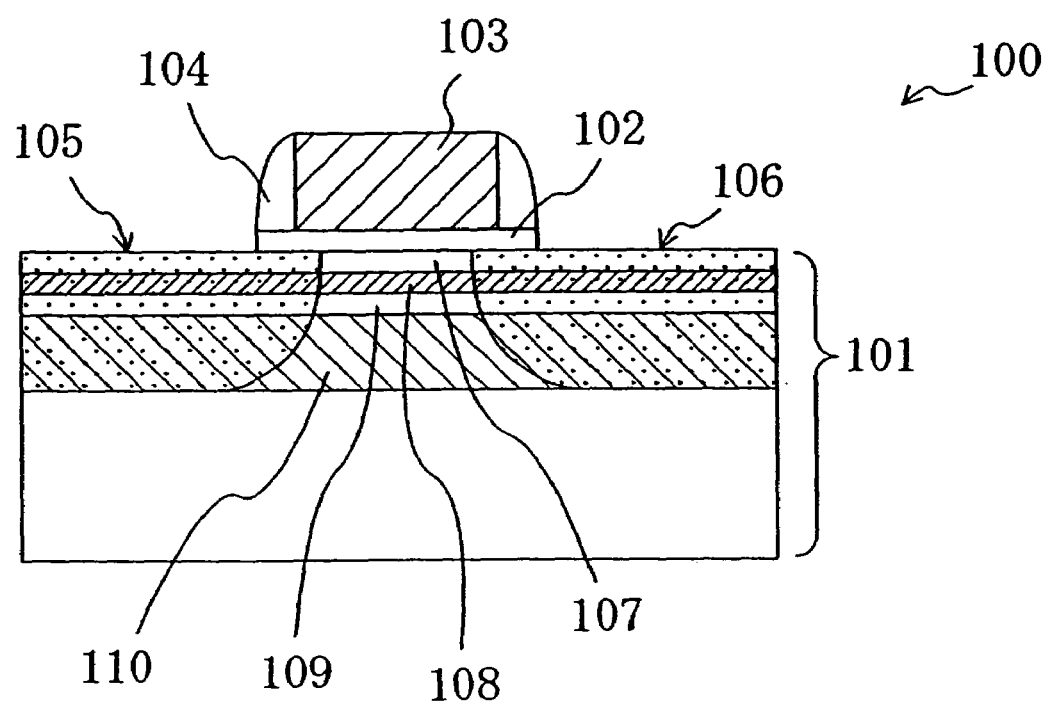
FIG. 15 is a cross-sectional view illustrating the structure of the known hetero MOS.
Figure 16:
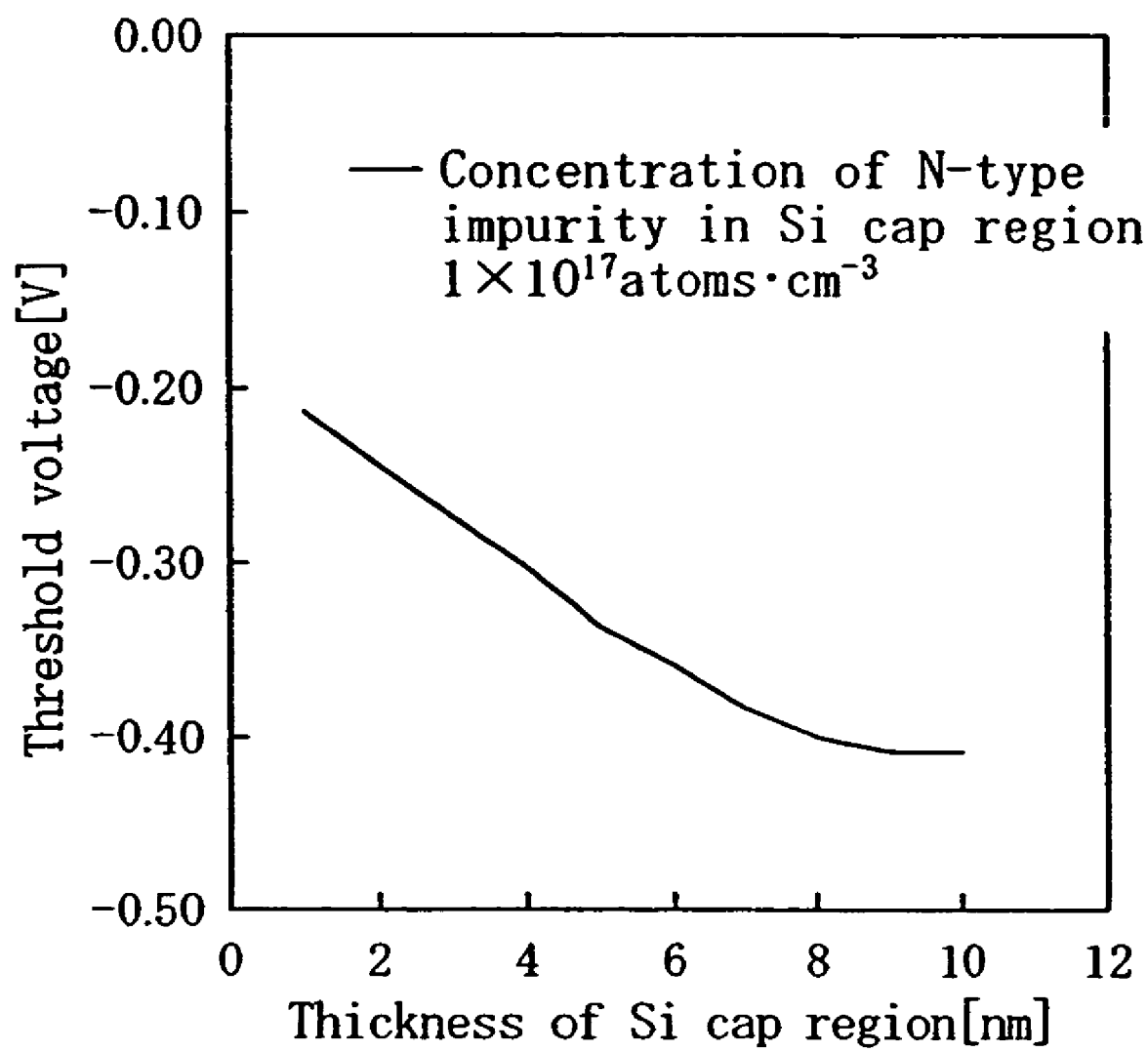
FIG. 16 is a graph showing the results obtained from simulations of dependency of threshold voltage on the thickness of the Si cap region in the known hetero MOS.

FIG. 14 shows the Ge contents and the impurity profiles in the Si body region 21, the Si buffer region 22, the SiGe channel region 23 and the Si cap region 24 of the p-hetero MOS included in the complementary hetero MOS of this embodiment.

As shown in FIG. 14, the concentration of the p-type impurity is the highest ($5\times10^{17}$ atoms·cm$^{-3}$) at the surface of the Si cap region 24 and the concentration is reduced with increasing depth from the surface.

In this manner, the Si cap region 24 is formed through introduction of a p-type impurity by ion implantation according to the method for fabricating the complementary hetero MOS of this embodiment and thus there may be cases where the p-type impurity reaches a region located directly under the Si cap region 24. If the p-type impurity reaches the region located directly under the cap region 24, a region through which holes travel may be formed, besides the interface between the Si cap region 24 and the SiGe channel region 23, in a region located at a greater depth from the surface of the Si cap region 24 (e.g., in the Si buffer region 22). Therefore, it is difficult to control the drain current to be ON/OFF by gate bias voltage that is applied to the gate electrode 13. In other words, the characteristics of the p-hetero MOS are degenerated.

Therefore, it is preferable to adjust conditions for ion implantation such that the p-type impurity does not reach the Si buffer region 22 as much as possible. It is also preferable to set the concentration of the p-type impurity at the highest level in the Si cap region 24 or the SiGe channel region 23

(i.e., to put the peak of the p-type impurity profile in the Si cap region 24 or the SiGe channel region 23). Specifically, it is preferable that the concentration of the p-type impurity is the highest in the Si cap region 24. It is further preferable that the concentration of the p-type impurity is the highest at the surface of the Si cap region 24.

In this manner, according to this embodiment, a complementary hetero MOS including a high-performance p-hetero MOS can be obtained without the characteristics of an n-hetero MOS being degenerated.

INDUSTRIAL APPLICABILITY

The present invention can be utilized for field effective transistors, such as heterojunction MOS transistors and hetero junction DTMOS transistors, including a heterojunction for a channel region.

The invention claimed is:

1. A method for fabricating a semiconductor device comprising the steps of:
   a) forming in an upper part of a semiconductor substrate a first semiconductor layer including a first semiconductor region into which an impurity of a first conductivity type is doped and a second semiconductor region into which an impurity of a second conductivity type is doped as a complementary device;
   b) forming on the first semiconductor layer a second semiconductor layer and a third semiconductor layer which is formed of a semiconductor having a wider band gap than the second semiconductor layer;
   c) forming a mask on part of the third semiconductor layer located in the first semiconductor region, and then introducing an impurity of the first conductivity type into part of the third semiconductor layer located at least in the second semiconductor region, using the mask;
   d) removing the mask and then forming a gate insulating film and a gate electrode on part of the third semiconductor layer located in the first semiconductor region and part of the third semiconductor layer located in the second semiconductor region, respectively; and
   e) forming source/drain regions of the second conductivity type and source/drain regions of the first conductivity type in the first semiconductor region and in the second semiconductor region, respectively, by implanting ions of respective impurities into the first, second and third semiconductor layers using each of the gate electrodes as a mask.

2. The semiconductor device fabrication method of claim 1, characterized in that in the step c), ions of the impurity of the first conductivity type are implanted so that the peak of the concentration profile of the impurity of the first conductivity type is in the second semiconductor layer or the third semiconductor layer.

* * * * *